(12) United States Patent
Sankman et al.

(10) Patent No.: US 9,190,388 B2
(45) Date of Patent: Nov. 17, 2015

(54) USING AN OPTICALLY TRANSPARENT SOLID MATERIAL AS A SUPPORT STRUCTURE FOR ATTACHMENT OF A SEMICONDUCTOR MATERIAL TO A SUBSTRATE

(75) Inventors: Robert L. Sankman, Phoenix, AZ (US); Edward A. Zarbock, Gilbert, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/997,649

(22) PCT Filed: Dec. 19, 2011

(86) PCT No.: PCT/US2011/065920
§ 371 (c)(1),
(2), (4) Date: Oct. 9, 2013

(87) PCT Pub. No.: WO2013/095344
PCT Pub. Date: Jun. 27, 2013

(65) Prior Publication Data
US 2014/0024174 A1   Jan. 23, 2014

(51) Int. Cl.
*H01L 25/03* (2006.01)
*H01L 21/683* (2006.01)
*H01L 23/00* (2006.01)

(52) U.S. Cl.
CPC ............ *H01L 25/03* (2013.01); *H01L 21/6836* (2013.01); *H01L 24/81* (2013.01); *H01L 24/13* (2013.01); *H01L 24/16* (2013.01); *H01L 2224/131* (2013.01); *H01L 2224/16225* (2013.01); *H01L 2224/32225* (2013.01); *H01L 2224/73204* (2013.01); *H01L 2224/81005* (2013.01); *H01L 2224/8121* (2013.01);
(Continued)

(58) Field of Classification Search
CPC ......... H01L 21/50; H01L 23/48; H01L 25/03; H01L 31/0203; H01L 21/00; H01L 21/78; H01L 31/18
USPC ........................................................ 438/106
See application file for complete search history.

(56) References Cited

U.S. PATENT DOCUMENTS 6,320,266 B1 * 11/2001 Hatchard ...................... 257/778
7,015,064 B1 *  3/2006 Patwardhan et al. ......... 438/106
(Continued)

OTHER PUBLICATIONS

International Preliminary Report on Patentability (IPRP) for PCT Application No. PCT/US2011/065920, dated Jul. 3, 2014, 7 pp.
(Continued)

*Primary Examiner* — Karen Kusumakar
*Assistant Examiner* — Adam S Bowen
(74) *Attorney, Agent, or Firm* — Konrad Raynes Davda & Victor LLP; Alan S. Raynes

(57) ABSTRACT

Electronic devices and methods for fabricating electronic devices are described. One method includes attaching an optically transparent solid material to a body of semiconducting material in which microelectronic devices are formed. The method also includes attaching a first surface of a body portion, comprising a portion of the body, to a substrate while a portion of the optically transparent solid material is attached to a second surface of the body portion. The method also includes removing the optically transparent solid material from the second surface of the body portion after the attaching the first surface of the body portion to the substrate.

19 Claims, 7 Drawing Sheets

(52) U.S. Cl.
CPC ............... *H01L2224/81191* (2013.01); *H01L 2224/81815* (2013.01); *H01L 2224/82005* (2013.01); *H01L 2224/83104* (2013.01); *H01L 2924/07802* (2013.01); *H01L 2924/3511* (2013.01)

(56) References Cited

U.S. PATENT DOCUMENTS

| | | | |
|---|---|---|---|
| 7,101,620 B1* | 9/2006 | Poddar et al. | 428/354 |
| 7,135,385 B1* | 11/2006 | Patwardhan et al. | 438/464 |
| 7,534,715 B2 | 5/2009 | Jadhav et al. | |
| 8,143,721 B2 | 3/2012 | Ongchin et al. | |
| 2007/0155049 A1* | 7/2007 | Tsai | 438/106 |
| 2008/0003720 A1* | 1/2008 | Lu et al. | 438/113 |
| 2008/0217715 A1* | 9/2008 | Park et al. | 257/434 |

OTHER PUBLICATIONS

International Search Report and Written Opinion for International Application No. PCT/US2011/065920, dated Sep. 12, 2012, 10 pp. [77.237PCT (ISR & WO)].

Wikipedia, "Flip Chip", [online], last modified Nov. 17, 2011, [Retrieved on Dec. 14, 2011], Retrieved from the Internet at <URL: http://en.wikipedia.org/w/index.php?title=Flip_chip&oldid=461123378>, 4 pp.

* cited by examiner

USING AN OPTICALLY TRANSPARENT SOLID MATERIAL AS A SUPPORT STRUCTURE FOR ATTACHMENT OF A SEMICONDUCTOR MATERIAL TO A SUBSTRATE

RELATED ART

Integrated circuits may be formed on semiconductor wafers made from materials such as silicon. The semiconductor wafers are processed to form various electronic devices. The wafers are diced into semiconductor chips (a chip is also known as a die), which may then be attached to a package substrate using a variety of known methods. In one known method for attaching a chip or die to a package substrate, the die may have solder bump contacts which are electrically coupled to the integrated circuit. The solder bump contacts extend onto the contact pads of a package substrate, and are typically attached in a thermal reflow process. Electronic signals may be provided through the solder bump contacts to and from the integrated circuit on the die.

When exposed to up to 250 Celsius during the reflow heat process, the die may experience warpage due to coefficient of thermal expansion (CTE) mismatch of the materials of the die and the substrate. Thermal expansion mismatch between the multiple metal layers in the die and the bulk silicon can lead to stresses developing in the electronic assembly during processing procedures, in particular, during heating and cooling operations such as solder reflow. Such stresses may cause destructive warpage that prevents the successful soldering of the die and the substrate. As electronic devices and package substrates become more thin, warpage effects will become more pronounced and have a more severe impact on assembly process yields.

Package substrate warpage problems may be addressed using a number of approaches. For example, a thicker die and substrate may be used. The thicker die and substrate are more rigid due to the increased thickness and thus less likely to undergo destructive warpage that may prevent successful soldering of the die and the substrate. However, this approach conflicts with the industry trend to produce thinner dies. Another approach is to use a heat spreader coupled to the die and the substrate. The heat spreader also makes the assembly more rigid and less prone to warpage. Still another approach is to use a stiffener coupled to the package substrate. The stiffener may take the form of a metal ring coupled to the package substrate. The metal ring adds mass to the assembly and makes it more rigid and less prone to warpage. All of these methods add substantial mass and thickness to the package substrate assembly and do not allow for thinner packages.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic assemblies. Embodiments include both devices and methods for forming electronic assemblies.

In current semiconductor processing systems, such as with flip chips, the chips are bonded to the substrate in a reflow oven to melt the solder balls on the surface of the chip to connect to the substrate. Chips having a full thickness, for example of 800 µm, generally experience little or no destructive warpage when exposed to the heating of a reflow oven, such as at temperatures of 250 Celsius. Current chip design techniques seek to thin the chip to reduce the size, such as to 200 µm or less. Such chips having thinner profiles are more likely to experience destructive warpage when exposed to the temperatures of a reflow oven, such as 250 Celsius, whereas a chip that is not thinned having a thickness of 800 µm has sufficient silicon bulk to resist destructive warpage from the reflow heating process.

For instance, it has been observed that a 22×33 mm die should remain at full thickness (800 µm) to solder successfully with minimal or no warpage, at 130 µm solder bump pitch using the reflow heating process. A 11×22 mm die may be thinned to 300-400 µm and still have an acceptable chip attach yield with a 90 µm solder pitch. For a 9×9 mm die at thickness below 200 µm, unacceptable levels of warpage may occur with current reflow oven heating processes. For packages thinned below such levels, a thermal compression bonding technique is used to perform the chip attach. However, thermal compression bonding (TCB) is several times more expensive than the reflow heating process because TCB can overcome die and substrate warpage using vacuum die nozzles and substrate pedestals.

Certain embodiments relate to electronic assemblies. Embodiments include both devices and methods for forming electronic assemblies.

Figure 1:
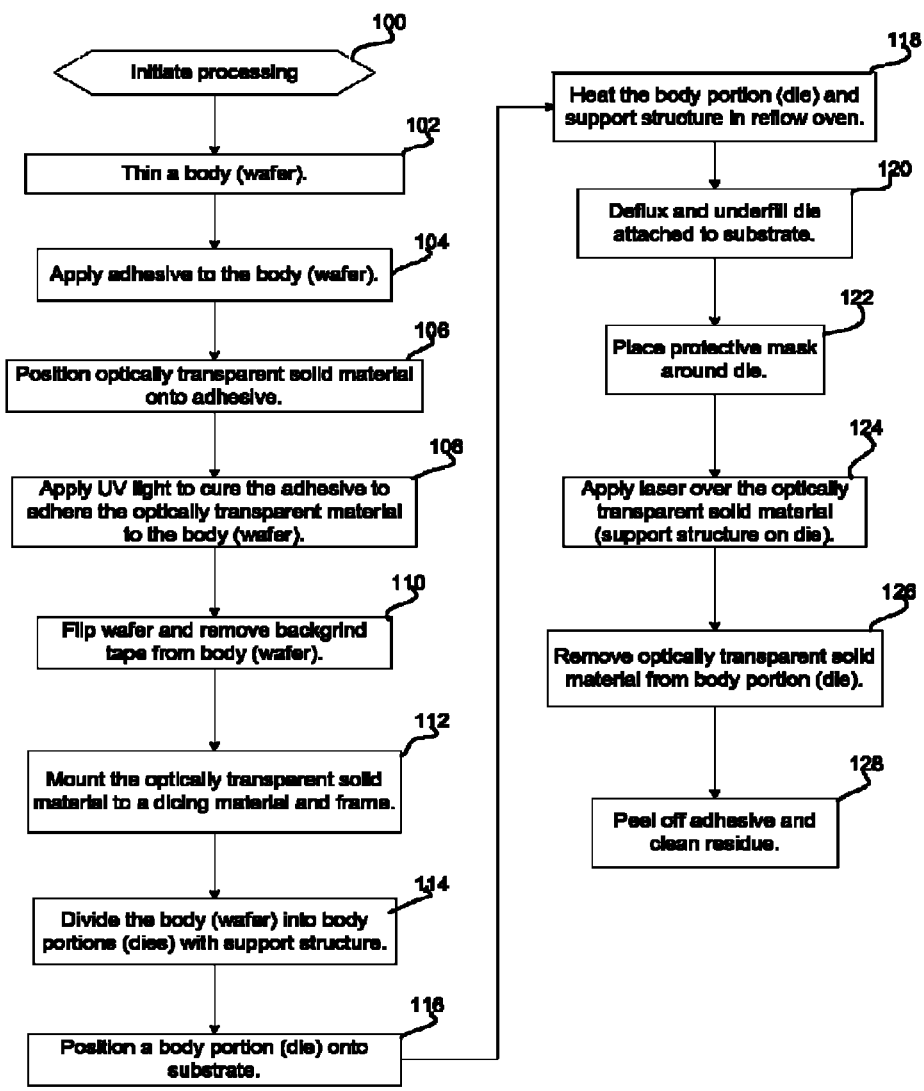
FIG. 1 illustrates an embodiment of a flow of operations for forming an assembly.

FIG. 1 illustrates a flow of operations to attach a die to a substrate in accordance with described embodiments. The operations of FIG. 1 are described with respect to the semiconductor devices described with respect to FIGS. 2-14. The operations described herein may be performed using semiconductor fabrication systems and machines known in the art comprised of a plurality of stations to perform the processing of the semiconductor devices as described herein.

Figure 2:
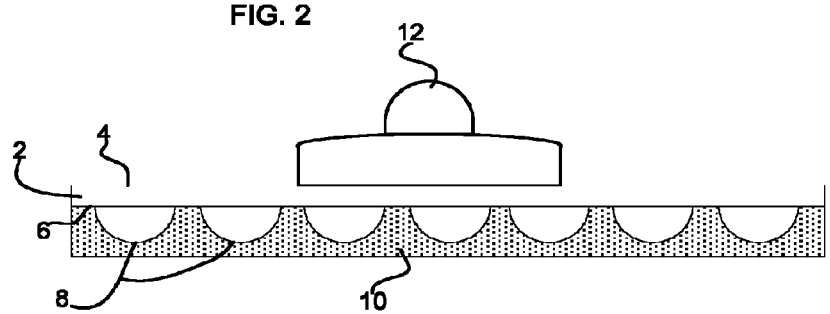
FIGS. 2-13 illustrate processing operations for attaching a die structure to a substrate, in accordance with certain embodiments.

With respect to FIG. 1, at block 100 the assembly of a body of semiconducting material in which microelectronic devices are formed, such as a wafer, is initiated. FIG. 2 shows the body 2 (wafer) in an inverted orientation, having a back surface 4 and a top surface 6. Integrated circuits comprising semiconductor devices may be formed in the wafer 2. Metallic bumps 8, such as solder balls, are formed on the front surface 6 of the body 2 (wafer) through a heating process. The solder balls would be deposited on pads (not shown) attached to the first surface 6 of the body 2. A backgrind tape 10 may be deposited on the top surface 6 to position the body 2 (wafer) for wafer thinning, e.g., grinding and polishing, (at step 102) by a wafer thinning tool 12 on the top surface 6 to thin the body 2 (wafer) to a thickness of 150 µm to 300 µm.

Figure 3:
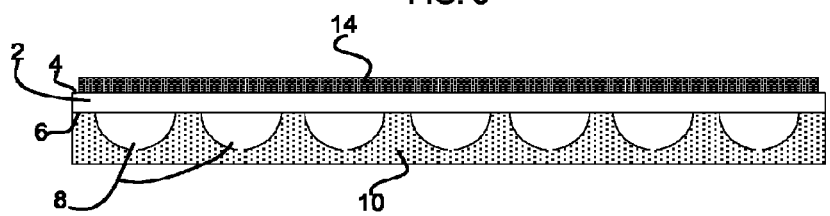
Figure 4:
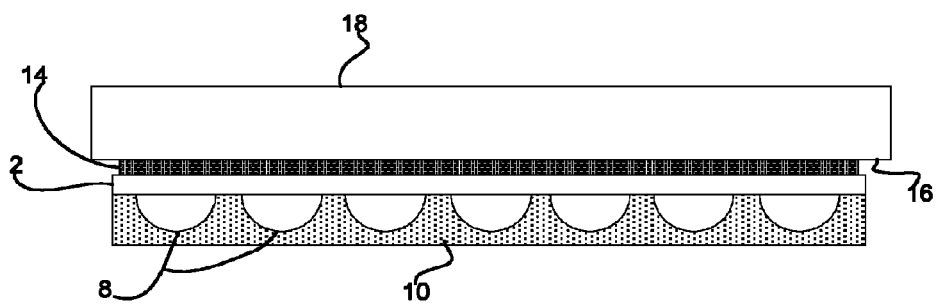

At step 104, an adhesive 14 is applied to the back surface 4 of the inverted body 2 (wafer), as shown in FIG. 3. The adhesive 14 may comprise a suitable spin coat ultraviolet (UV) curable/laser release adhesive.

At step 106, a first surface 16 of an optically transparent solid material 18 is positioned (FIG. 4) onto the adhesive 14 layer. The optically transparent solid material 18 may comprise, in certain embodiments, an amorphous non-crystalline solid material, such as glass. In one embodiment, the glass may comprise a 500-700 µm sacrificial glass wafer. In this way, the optically transparent solid material 18 has a thickness multiple times greater than the body, such as up to ten times thicker than the body of a wafer thinned to 100 µm.

Figure 5:
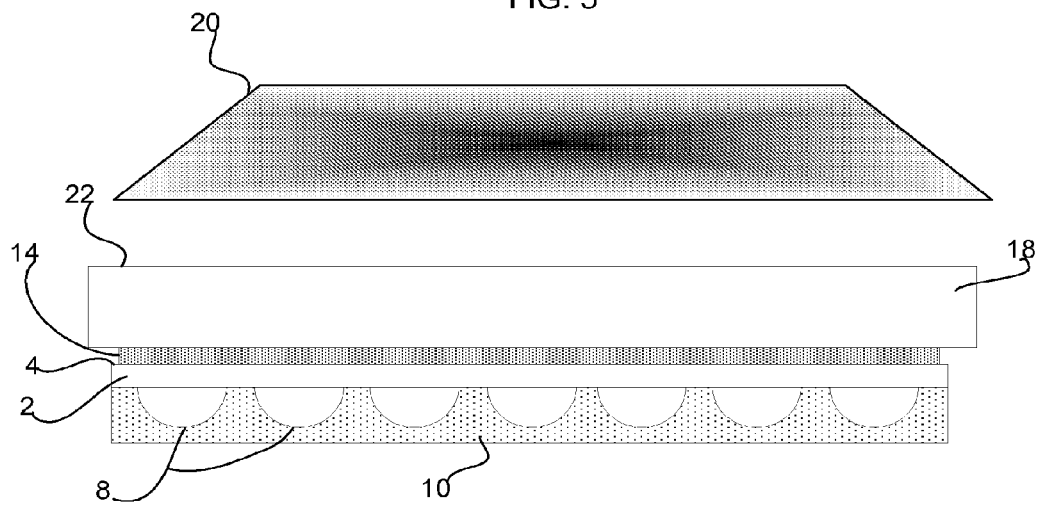

At step 108, as shown in FIG. 5, an ultraviolet (UV) laser light 20 is applied to a second surface 22, opposite the surface 16, of the optically transparent solid material 18 to cure the adhesive 10 and bond the optically transparent solid material 18 to the bottom surface 4 of the body 2 (wafer).

Figure 6:
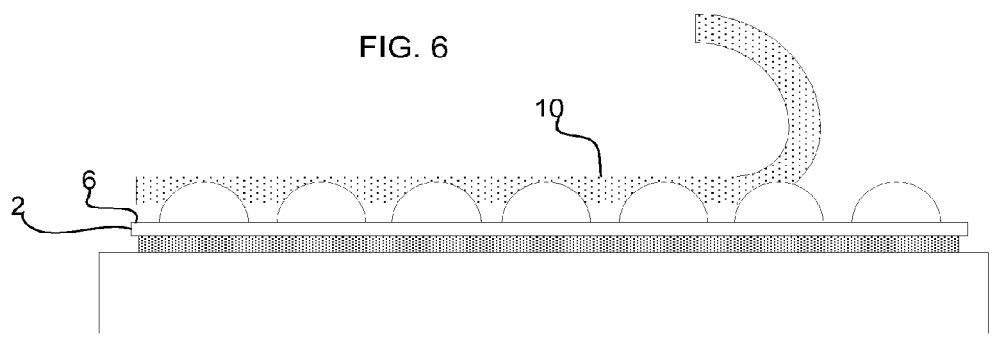

At step 110, the body 2 (wafer) is flipped, as shown in FIG. 6, to locate the top surface 6 in an upward orientation, and the backgrind tape 10 is removed.

Figure 7:
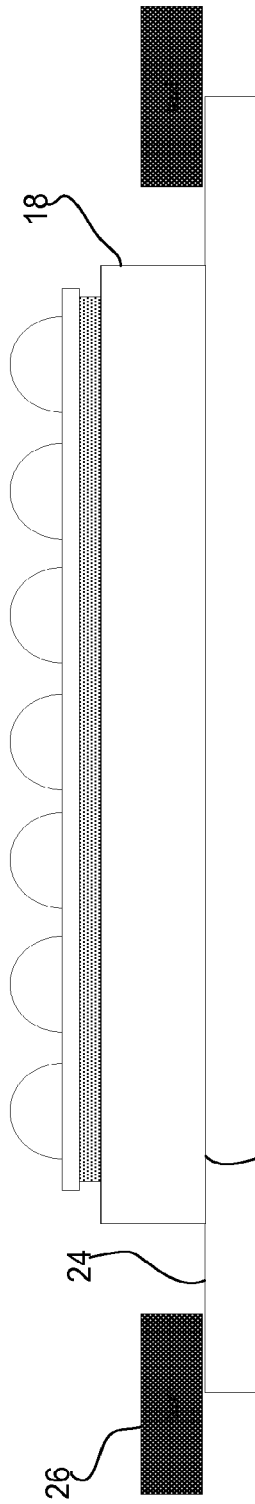
Figure 8:
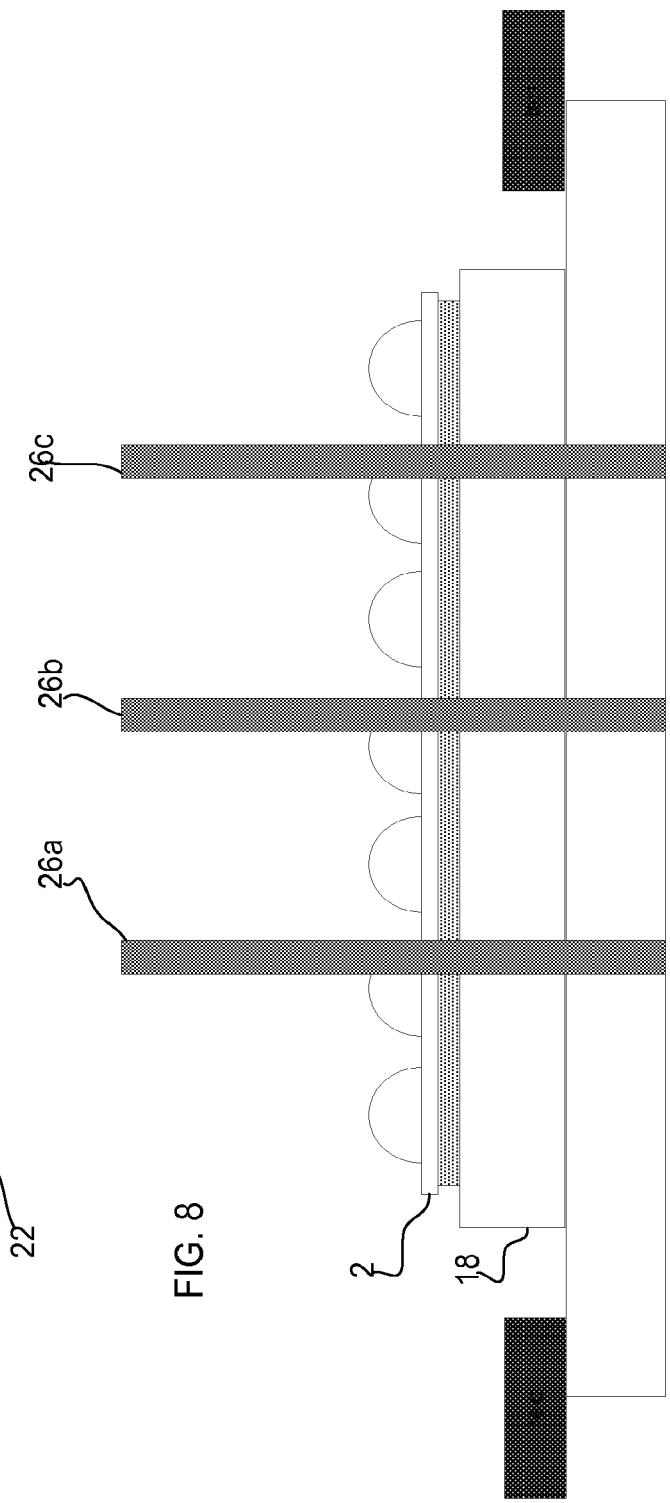

At step 112 and as shown in FIG. 7, the second surface 22 of the optically transparent solid material 18 is mounted to a dicing material 24 and frame 26 to maintain the position of the body 22 (wafer) and attached optically transparent solid material 18 during the cutting process to form body portions (such as dies) out of the body (wafer) 22.

Figure 9:
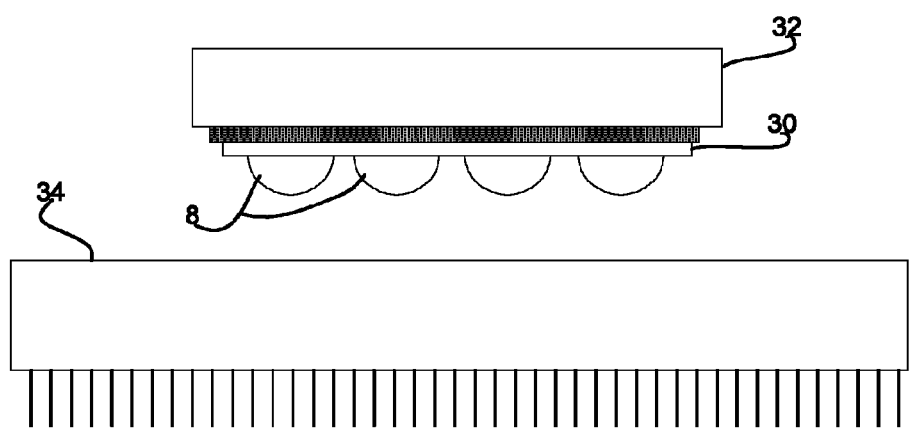

At step 114, the body 22 (wafer) is divided into body portions or dies coupled to the optically transparent solid material. FIG. 9 shows lasers 26a, 26b, 26c cutting through the body 2 (wafer) and the optically transparent solid material 18 to produce individual body parts or dies, each having their own Die Level Support System (DLSS) comprising the optically transparent solid material 18 attached to the die portion of the wafer before being cut.

Figure 10:
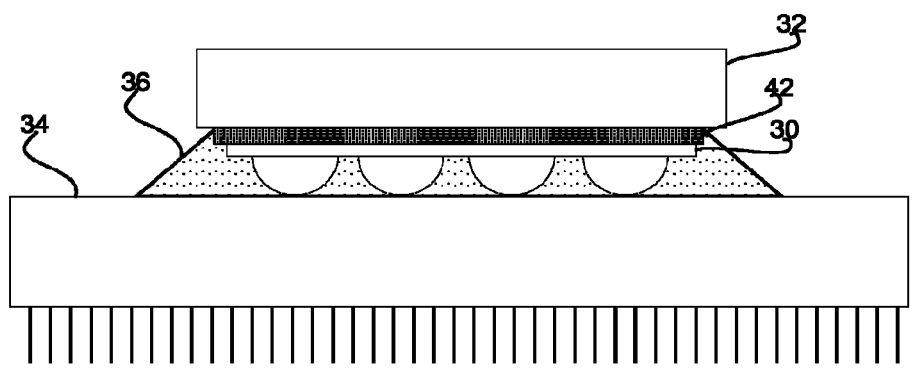

FIG. 10 shows an embodiment of one of the dies or body portions 30 cut from the body 22 (wafer) attached to optically transparent solid material 32, comprising a portion of the optically transparent solid material 18 cut at step 114.

At step 116 and as shown in FIG. 9, the body portion 30 (die) is positioned with respect to a substrate 34, which may comprise a semiconductor packaging material. The substrate 34 may comprise bulk silicon, such as the package, dielectric or underlying electronics, to which the die 30 is attached, to enable the die 30 to connect to a motherboard or circuit board.

At step 118, the body portion (die) 30 positioned on the substrate 34 is sent through a reflow oven to heat and melt the metal bumps 8, such as solder balls, to produce an electrical connection between the body portion 30 (die) and the substrate 34 as shown in FIG. 10. The DLSS comprised of the optically transparent solid material 32 attached to the body portion 30 (die) inhibits the die 30 from warping during the reflow heating process that reheats and melts the metal bumps 8.

At step 120, the body portion 30 (die) mounted on the substrate 34 is defluxed and underfilled with an electrically insulating adhesive, or underfill 36, as shown in FIG. 10, to provide a stronger mechanical connection between the body portion (die) 30 and the substrate 34. The underfill 36 may be thermally cured to bond the underfill 36 to the die 30 and the substrate 34. The underfill 36 is bonded to the die 30 and substrate 34 while the optically transparent solid material (support structure) is attached to the body portion 30 (die).

Figure 11:
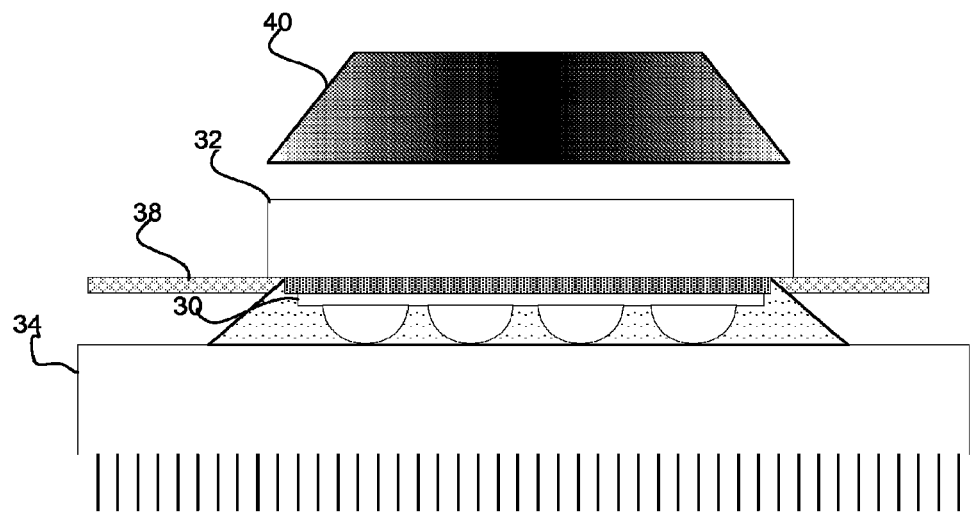

At step 122, a protective mask 38, shown in FIG. 11, is placed around the body portion 30 (die) to protect the underlying substrate 34 while, at step 124, a laser 40, such as a YAG laser, is rastered over the optically transparent solid material 32 attached to the body portion (die) 30. The mask 38 may have an opening through which the die 30 and optically transparent solid material 32 are exposed to the laser 40 so as to protect the region of the substrate 34 non-overlapping with respect to the body portion (die) 30. The application of the laser 40 breaks the adhesive bonds attaching the optically transparent solid material 32, functioning as the support structure (DLSS) for the heating process, from the body portion 30. Other suitable techniques may be used to remove the optically transparent solid material 32 from the die 30.

Figure 12:
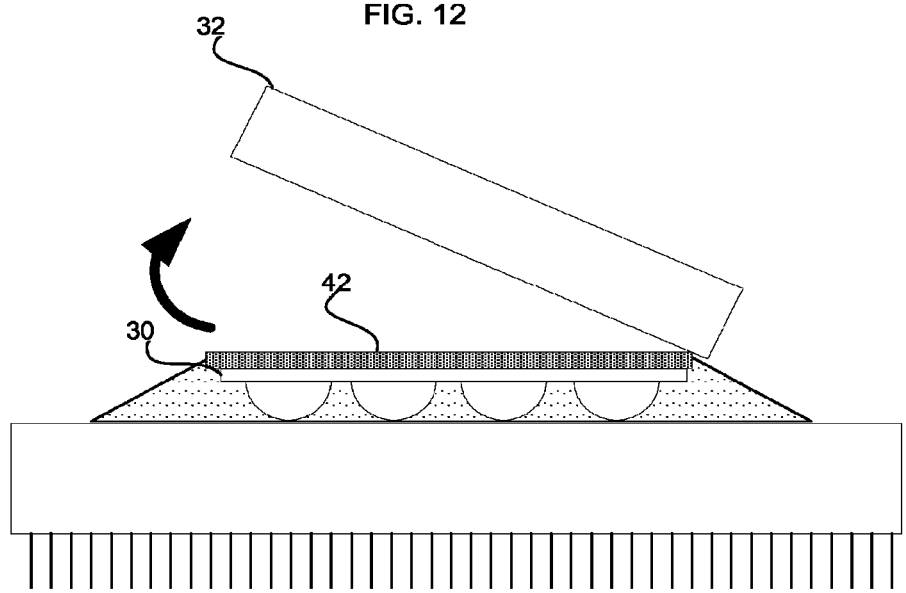
Figure 13:
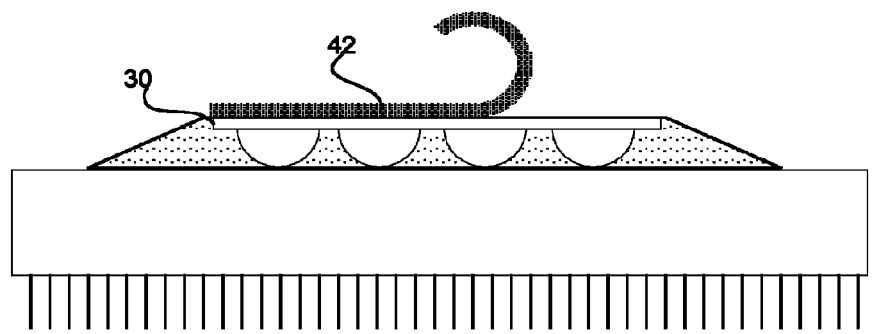

At step 126, the optically transparent solid material 32 is removed from the substrate 30 as shown in FIG. 12. The remaining adhesive 42, cut from the adhesive 14 applied to the body portion (wafer) 2, may then be removed from the body portion 30 (die), as shown in FIG. 13, during a clean-up process at block 128, during which any remaining residue is also removed.

With the described embodiments, an optically transparent solid material is attached to a wafer, and then dies cut from the wafer include the portion of the optically transparent solid material attached to the die portion when the wafer was cut. The optically transparent solid material provides a support structure to inhibit warping of a relatively thin die, such as from 150-300 μm thick, during the reflow heating process to melt the metal balls to electrically connect the die to the substrate. The process of the described embodiments for using an optically transparent solid material die support structure in a reflow heating process is substantially less expensive than other processes to attach the die to the substrate, such as thermo compression bonding processes (TCB).

Figure 14:
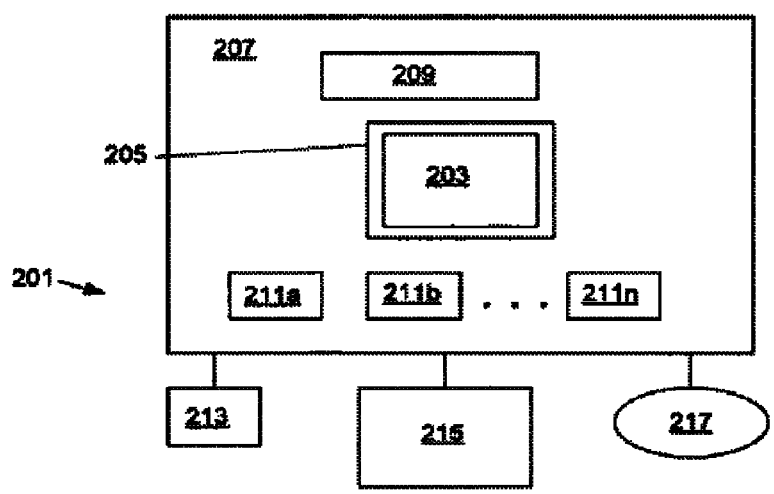
FIG. 14 illustrates an electronic system arrangement in which certain embodiments may find application.

Assemblies including a substrate and chip joined together as described in embodiment above may find application in a variety of electronic body portions. FIG. 14 schematically illustrates one example of an electronic system environment in which aspects of described embodiments may be embodied. Other embodiments need not include all of the features specified in FIG. 14, and may include alternative features not specified in FIG. 14.

The system 201 of FIG. 14 may include at least one central processing unit (CPU) 203. The CPU 203, also referred to as a microprocessor, may be a chip which is attached to an integrated circuit package substrate 205, which is then coupled to a printed circuit board 207, which in this embodiment, may be a motherboard. The CPU 203 on the package substrate 205 is an example of an electronic device assembly that may have a structure including copper, tin, silver, indium or other suitable materials in the bump area between the package and chip, in accordance with embodiments, such as described above. A variety of other system body portions, including, but not limited to memory and other body portions discussed below, may also include chip and substrate structured formed in accordance with the embodiments described above.

The system 201 further may further include memory 209 and one or more controllers 211a, 211b . . . 211n, which are also disposed on the motherboard 207. The motherboard 207 may be a single layer or multi-layered board which has a plurality of conductive lines that provide communication between the circuits in the package 205 and other body portions mounted to the board 207. Alternatively, one or more of the CPU 203, memory 209 and controllers 211a, 211b . . . 211n may be disposed on other cards such as daughter cards or expansion cards. The CPU 203, memory 209 and controllers 211a, 211b . . . 211n may each be seated in individual sockets or may be connected directly to a printed circuit board. A display 215 may also be included.

Any suitable operating system and various applications execute on the CPU 203 and reside in the memory 209. The content residing in memory 209 may be cached in accordance with known caching techniques. Programs and data in memory 209 may be swapped into storage 213 as part of memory management operations. The system 201 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired); network appliance, virtualization device, storage controller, network controller, router, etc.

The controllers 211a, 211b ... 211n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 213 in accordance with a storage protocol layer. The storage protocol of the layer may be any of a number of known storage protocols. Data being written to or read from the storage 213 may be cached in accordance with known caching techniques. A network controller can include one or more protocol layers to send and receive network packets to and from remote devices over a network 217. The network 217 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. A method comprising:
    attaching an optically transparent solid material to a body of semiconducting material in which microelectronic devices are formed;
    attaching the body to a substrate while the optically transparent solid material is attached to the body, wherein the attaching the body to the substrate includes forming a solder connection between the body and the substrate, wherein the body is positioned between the optically transparent solid material and the substrate; and
    removing the optically transparent solid material from the body after the attaching the body to the substrate.

2. The method of claim 1, wherein attaching the optically transparent solid material to the body comprises;
    applying an adhesive to the body; and
    adhering the optically transparent solid material to the body with the adhesive.

3. The method of claim 2, further comprising:
    applying an ultraviolet light to cure the adhesive to attach the optically transparent solid material to the body.

4. The method of claim 1, wherein the optically transparent solid material comprises an amorphous non-crystalline solid material.

5. The method of claim 1, wherein the optically transparent solid material has a thickness greater than a thickness of the body.

6. The method of claim 5, wherein the thickness of the optically transparent solid material is less than or equal to ten times thicker than the thickness of the body.

7. The method of claim 1, wherein the forming a solder connection comprises providing a plurality of solder bumps on the body portion, positioning the solder bumps on the substrate, and heating the solder bumps.

8. The method of claim 1, wherein the removing the optically transparent solid material comprises:
    providing a mask that exposes the optically transparent solid material attached to the body and extends around a region of the substrate non-overlapping with the body, and
    applying a laser over the optically transparent solid material to separate the optically transparent solid material from the body.

9. A method comprising:
    attaching an optically transparent solid material to a first surface of a body comprising a semiconducting material in which microelectronic devices are formed;
    attaching a second surface of the body to a substrate, wherein the attaching the second surface of the body to the substrate comprises forming an electrically conductive pathway between the body and the substrate; and
    removing the optically transparent solid material from the first surface of the body after the coupling the second surface of the body to the substrate.

10. The method of claim 9, wherein the body is positioned between the optically transparent solid material and the substrate.

11. The method of claim 9, wherein the attaching the optically transparent solid material to the body comprises;
    applying an adhesive to the body; and
    adhering the optically transparent solid material to the body with the adhesive.

12. The method of claim 9, wherein the attaching the optically transparent solid material comprises:
    applying an adhesive to the body;
    positioning the optically transparent solid material on the adhesive; and
    applying an ultraviolet light to cure the adhesive to attach the optically transparent solid material to the body.

13. The method of claim 9, wherein the optically transparent solid material comprises an amorphous non-crystalline solid material.

14. The method of claim 9, wherein the optically transparent solid material has a thickness greater than a thickness of the body.

15. The method of claim 14, wherein the thickness of the optically transparent solid material is less than or equal to ten times thicker than the thickness of the body.

16. A method comprising:
    attaching an optically transparent solid material to a semiconductor wafer;
    attaching a first surface of a portion of the semiconductor wafer to a substrate while a portion of the optically transparent solid material is attached to a second surface of the portion of the semiconductor wafer, wherein the attaching the first surface to the substrate comprises forming an electrically conductive pathway between the first surface and the substrate; and
    removing the portion of the optically transparent solid material from the second surface after the attaching the first surface.

17. The method of claim 16, wherein the portion of the semiconductor wafer comprises a die formed from the semiconductor wafer.

18. The method of claim 17, wherein the forming an electrically conductive pathway comprises forming a solder connection between the first surface and the substrate.

19. The method of claim 17, wherein the portion of the semiconductor wafer is positioned between the optically transparent solid material and the substrate.

* * * * *